(12) United States Patent
Nakamura

(10) Patent No.: US 7,748,113 B2
(45) Date of Patent: Jul. 6, 2010

(54) ELECTRONIC COMPONENT MOUNTING METHOD

(75) Inventor: Kouichirou Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 577 days.

(21) Appl. No.: 11/645,702

(22) Filed: Dec. 27, 2006

(65) Prior Publication Data

US 2007/0157462 A1     Jul. 12, 2007

(30) Foreign Application Priority Data

Jan. 10, 2006    (JP) .............................. 2006-002671

(51) Int. Cl.
*H05K 3/34* (2006.01)

(52) U.S. Cl. .............................. 29/840; 29/834; 29/742; 361/688

(58) Field of Classification Search ................. 29/832, 29/834, 840, 841, 739, 742; 257/706, 750, 257/778, 782, 796; 361/688, 704, 705
See application file for complete search history.

(56) References Cited

U.S. PATENT DOCUMENTS

| 5,811,317 | A | 9/1998 | Maheshwari et al. | |
| 6,618,937 | B2 * | 9/2003 | Onitsuka | 29/832 |
| 7,023,089 | B1 * | 4/2006 | Lu | 257/751 |
| 7,051,431 | B2 * | 5/2006 | Ueda et al. | 29/832 |
| 2001/0005602 | A1 | 6/2001 | Mimata et al. | |
| 2002/0004980 | A1 | 1/2002 | Onitsuka | |
| 2004/0205961 | A1 | 10/2004 | Haji et al. | |

FOREIGN PATENT DOCUMENTS

| FR | 2 803 413 | 7/2001 |
| JP | 2000-137781 | 5/2000 |
| JP | 2001-028381 | 1/2001 |
| WO | WO 2004/098258 | 11/2004 |

OTHER PUBLICATIONS

European Search Report dated May 8, 2008 for Appln. No. 07000029.4-2214.
Austrian Search Report dated May 16, 2008 for Appln. No. 200608999-9.

\* cited by examiner

*Primary Examiner*—Donghai D. Nguyen
(74) *Attorney, Agent, or Firm*—Pillsbury Winthrop Shaw Pittman, LLP

(57) ABSTRACT

An electronic component mounting apparatus includes a mounting device adapted such that the applying unit applies adhesive to a substrate located in a predetermined site, a mounting unit mounts an LSI onto the application of the adhesive, subsequently the applying unit applies another adhesive onto the LSI, and the mounting unit mounts a reinforcing plate onto the application of the adhesive, a conveying device which conveys the substrate with the LSI and reinforcing plate mounted in the predetermined site by the mounting device to a heating site, and a heating unit which bonds, by the application of heat, the LSI and reinforcing plate on the substrate conveyed to the heating site.

1 Claim, 9 Drawing Sheets

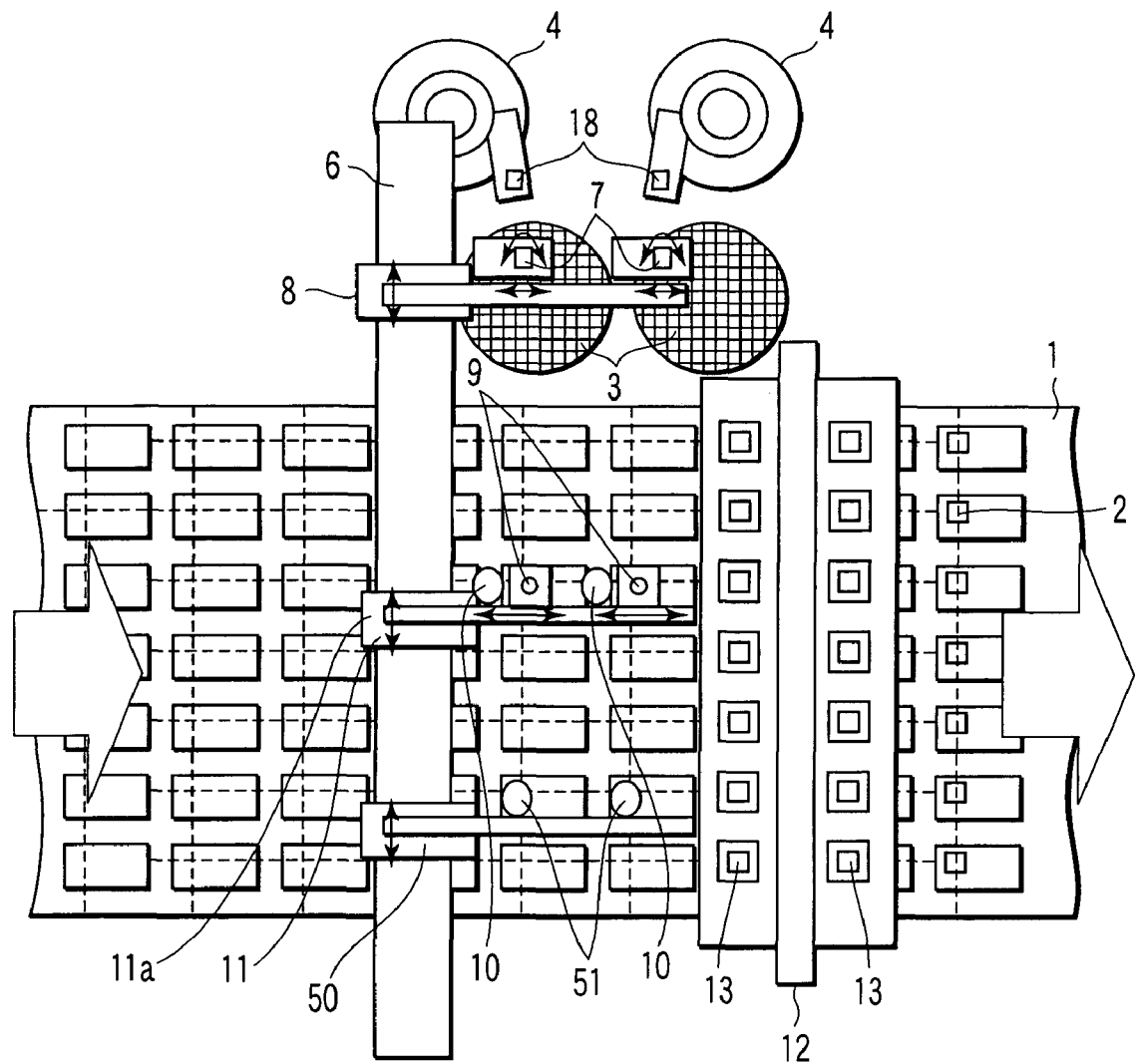
F I G. 11

ELECTRONIC COMPONENT MOUNTING METHOD

CROSS-REFERENCE TO RELATED APPLICATIONS

This application is based upon and claims the benefit of priority from prior Japanese Patent Application No. 2006-002671, filed Jan. 10, 2006, the entire contents of which are incorporated herein by reference.

BACKGROUND OF THE INVENTION

1. Field of the Invention

The present invention relates to an electronic component mounting apparatus, which mounts LSIs onto a substrate by a flip-chip bonding technique, and to an electronic component mounting method.

2. Description of Related Art

This type of electronic component mounting apparatus includes ones designed such that an applying mechanism applies an adhesive to a plurality of particular areas on a substrate, a mounting mechanism then mounts LSIs onto the adhesive areas, and a heating mechanism heats the LSIs, thereby bonding and fixing the LSIs to the substrate.

In order to improve the mechanical strength of the final product, an adhesive is further applied onto the LSIs bonded and fixed to the substrate, and reinforcing plates are mounted onto the adhesive area and bonded and fixed in position by the application of heat (refer to Jpn. Pat. Appln. KOKAI Publication No. 2001-28381).

However, such prior art approaches suffer from the problems described below. The site where adhesive is applied to a substrate is different from the site where LSIs are mounted. Accordingly, after the adhesive is applied to the substrate, the substrate must be moved to the site where the reinforcing plates are mounted on the LSIs. This decreases processing efficiency.

In addition, the site where LSIs are mounted and the site where reinforcing plates are mounted are different. Therefore, after the LSIs are mounted on the substrate, the substrate must be moved to the site where the reinforcing plates are mounted on the LSIs. This decreases processing efficiency and leads easily to displacement of the LSIs and the corresponding reinforcing plates.

Moreover, after reinforcing plates are mounted on LSIs, the substrate is moved to the heating site where the reinforcing plates are bonded and fixed to the LSIs by the application of heat. This necessitates providing separate heat bonding processes for the LSIs and the reinforcing plates respectively, which results in inefficient processing.

Furthermore, the need to provide separate mounting mechanisms for the LSIs and the reinforcing plates respectively results in a larger apparatus.

BRIEF SUMMARY OF THE INVENTION

The present invention was devised in view of the problems discussed above. It is therefore an object of the present invention to provide an electronic component mounting apparatus that eliminates the need to move a substrate to a site where an adhesive is applied and then to a site where electronic components are mounted, by conducting the application of the adhesive to the substrate and the mounting of the electronic components at the same site, and also that improves processing efficiency by simultaneously heating electronic components and corresponding reinforcing plates mounted on the substrate, and to provide an electronic component mounting method.

According to one aspect of the present invention, there is provided an electronic component mounting apparatus comprising: a mounting device having an applying unit and a mounting unit, wherein the applying unit applies adhesive to a substrate located in a predetermined site, the mounting unit mounts an electronic component onto the application of the adhesive, subsequently the applying unit applies adhesive onto the mounted electronic component, and the mounting unit mounts a reinforcing plate onto the application of the adhesives; a conveying device which conveys the substrate with the electronic component and reinforcing plate mounted in the predetermined site by the mounting device to a heating site; and a bonding device which bonds, by the application of heat, the electronic component and reinforcing plate on the substrate conveyed to the heating site by the conveying device.

According to one aspect of the present invention, there is provided an electronic component mounting apparatus comprising: a mounting device having an applying unit and a mounting unit, wherein the applying unit successively applies adhesive to a plurality of areas on a substrate located in a predetermined site, the mounting unit successively mounts electronic components onto the corresponding applications of the adhesive, subsequently the applying unit successively applies adhesive onto the corresponding electronic components, and the mounting unit successively mounts reinforcing plates onto the corresponding applications of the adhesives; a conveying device which conveys the substrate with said plurality of electronic components and corresponding reinforcing plates mounted in the predetermined site by the mounting device to a heating site; and a bonding device which bonds, by the application of heat, said plurality of electronic components and corresponding reinforcing plates on the substrate conveyed to the heating site by the conveying device.

According to one aspect of the present invention, there is provided an electronic component mounting apparatus comprising: a mounting device having an applying unit and a mounting unit, wherein the applying unit successively applies adhesive to a plurality of areas on a substrate located in a predetermined site, and the mounting unit successively mounts electronic components onto the corresponding applications of the adhesive; a conveying device which conveys the substrate with said plurality of electronic components mounted in the predetermined site by the mounting device to a heating site; and a bonding device which bonds, by the application of heat, the electronic components on the substrate conveyed to the heating site by the conveying device.

According to one aspect of the present invention, there is provided an electronic component mounting method comprising: a step in which an applying unit applies adhesive to a substrate located in a predetermined site, a mounting unit mounts an electronic component onto the application of the adhesive, subsequently the applying unit applies adhesive onto the mounted electronic component, and the mounting unit mounts a reinforcing plate onto the application of the adhesives; a step of conveying the substrate with the electronic component and reinforcing plate thus mounted to a heating site; and a step of bonding, by the application of heat, the electronic component and reinforcing plate on the substrate thus conveyed to the heating site.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 11 is a plan view showing an LSI mounting apparatus according to a fourth embodiment of the present invention.

DETAILED DESCRIPTION OF THE INVENTION

Referring to the accompanying drawings, there will be described embodiments of the invention.

Figure 1:
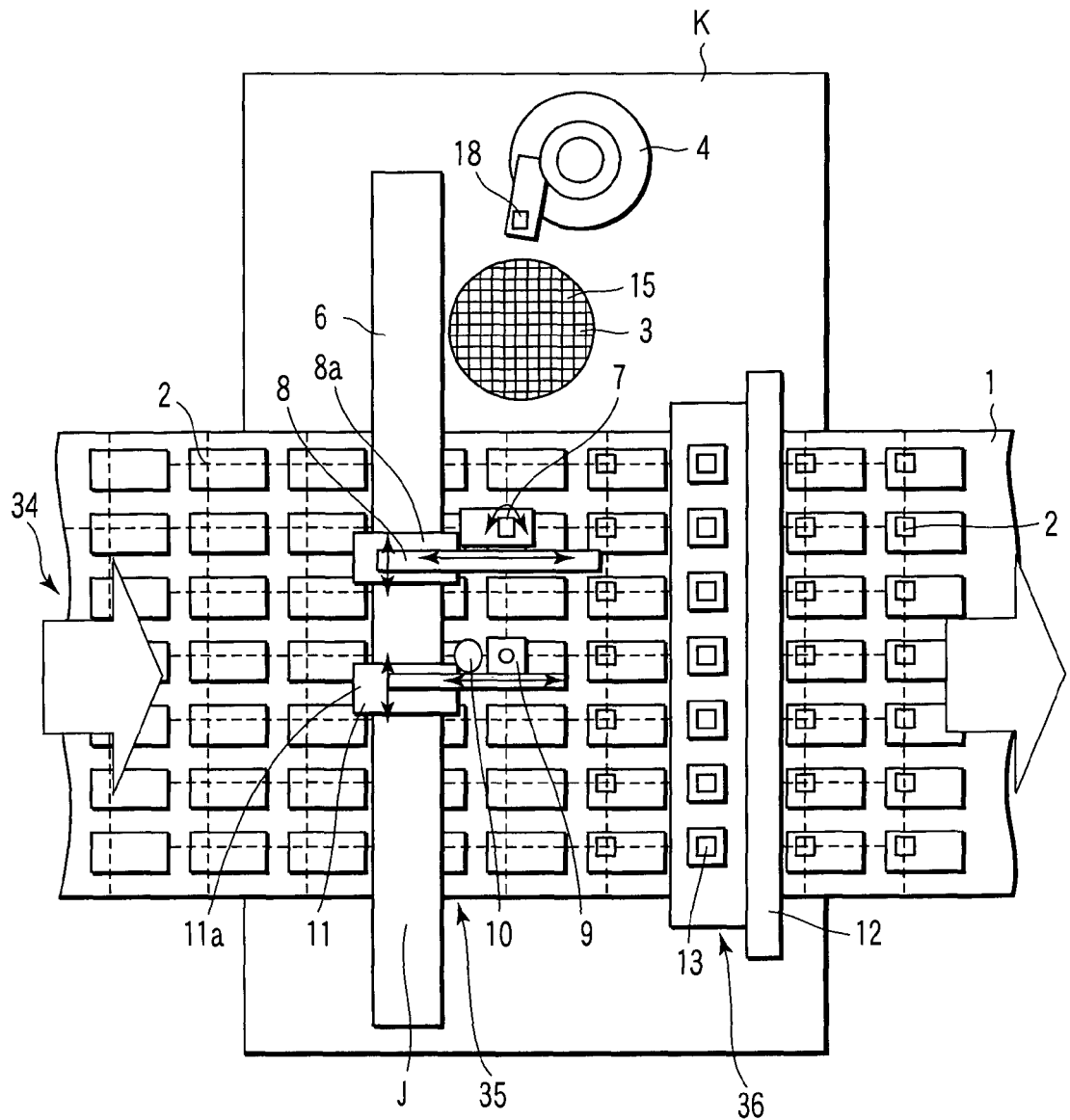
FIG. 1 is a plan view showing an LSI mounting apparatus according to one embodiment of the present invention.

FIG. 1 is a plan view showing an LSI mounting apparatus as an electronic component mounting apparatus according to a first embodiment of the invention.

In FIG. 1, reference number 1 denotes a continuous hoop-shaped substrate, on which LSIs, or electronic components, are to be mounted and which is conveyed along a conveying path 34 in the direction indicated by the arrows. When conveyed along the conveying path 34 and reaching a predetermined position 35 as described below, the substrate 1 is stopped in order that electronic components, namely LSIs, and reinforcing plates, are mounted on the substrate 1. The substrate 1 with the LSIs and the reinforcing plates mounted thereon is subsequently conveyed to a heating position 36, where the LSIs and reinforcing plates are heated.

On the substrate 1 are individual parts of the final product disposed at predetermined intervals in the direction of conveyance and at predetermined intervals in the direction of the width of the substrate 1. Seven individual parts of the final product are disposed in the direction of the width of the substrate 1. A wiring pattern is formed on each of the individual parts of the final product on the substrate 1, thus defining a corresponding mounting area 2 of LSIs. The substrate 1 with the LSIs and reinforcing plates mounted thereon is then conveyed to a cutting site where the substrate 1 is cut into individual parts that form the final products.

The mounting apparatus includes a base K. On one side of the upper face of the base K are an LSI wafer 3 and a supply hopper 4 used to supply each reinforcing plate 18. In addition, a mounting device J and a heating unit 12, which serves as a bonding device, are disposed on the base K in the direction of the conveyance of the substrate 1. The mounting device J is disposed in the predetermined site 35 in the conveying path 34, and the heating unit 12 is disposed in the heating area 36.

The mounting device J has a robot shaft 6 of a linear motor system, which extends perpendicular to the direction of conveyance of the substrate 1. The robot shaft 6 is disposed some distance opposite the upper face of the base K. Disposed on the robot shaft 6 are a mounting unit 8 and an applying unit 11.

The mounting unit 8 has a slider 8a movable in the axial direction of the robot shaft 6 as indicated by the arrows. The slider 8a is provided with a mounting head 7. The mounting head 7 is freely movable in a direction, as indicated by the arrows, perpendicular to the direction of movement of the slider 8a.

The mounting head 7 takes up each LSI 15 from the LSI wafer 3 or takes up each reinforcing plate 18 from the supply hopper 4 and conveys and supplies the LSI 15 or reinforcing plate 18 to the substrate 1. At this time, each LSI 15 is taken and conveyed by the mounting head 7 with the circuit face of the LSI 15 kept facing down.

The mounting head 7 is capable of rotating, and of fine positioning adjustment, in a planar direction so as to mount each LSI 15 and the corresponding reinforcing plate 18 onto the substrate 1 while correctly adjusting their mounting positions.

The applying unit 11 has a slider 11a movable in the axial direction of the robot shaft 6 as indicated by the arrows. The slider 11a is provided with a monitor camera 10 and an adhesive dispenser 9. The monitor camera 10 accurately determines the position of the substrate 1, and checks the quantity of adhesive dispensed, the mounted positions of each LSI 15 and corresponding reinforcing plate 18, the degree to which the adhesive has spread, and the like. The dispenser 9 applies the adhesive in the form of a paste, such as an anisotropic, conductive adhesive, or a regular epoxy adhesive.

The heating unit 12 includes a plurality of heating heads 13 (seven heating heads 13). The heating heads 13 are disposed perpendicular to the direction of conveyance of the substrate 1 so as to face from some distance above a plurality of individual parts of the final product on the substrate 1.

Figure 2:
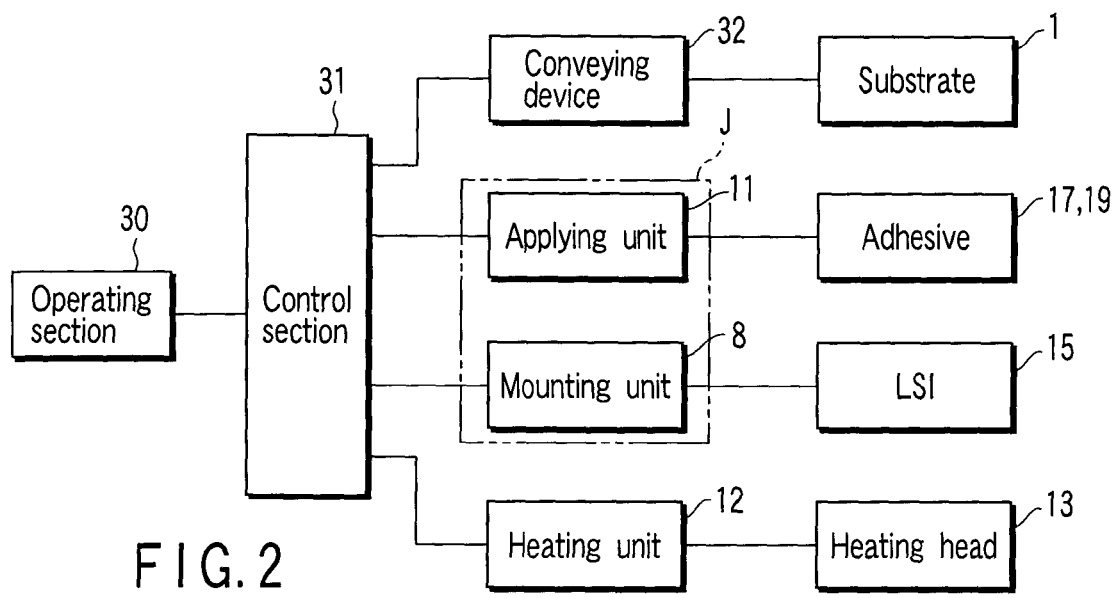
FIG. 2 is a block diagram showing a drive control system for the LSI mounting apparatus shown in FIG. 1.

FIG. 2 is a block diagram showing a drive control system for the LSI mounting apparatus described above.

In FIG. 2, reference number 30 denotes an operating section, to which a control section 31 is connected via a transmission circuit. A conveying device 32 for each substrate 1, the mounting device J, and the heating unit 12 are connected to the control section 31 via a control circuit such that their operations are controlled by the control section 31.

Figure 3:
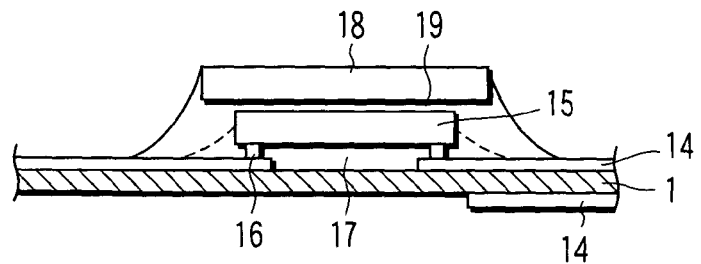
FIG. 3 is a sectional view showing an LSI flip mount product with a reinforcing plate, produced by the LSI mounting apparatus shown in FIG. 1.

FIG. 3 is a sectional view showing an LSI flip mount product with a reinforcing plate attached thereto, which is produced by the LSI mounting apparatus described above.

Wiring patterns 14 are formed on both sides of the substrate 1, and each LSI 15 is mounted in an LSI mounting position on the substrate 1 using an adhesive 17. Mounted on the upper face (rear face) of each of the LSIs 5 via an adhesive 19 is the reinforcing plate 18. The reinforcing plate 18 is made from a metal (e.g., tungsten or stainless steel), ceramic, a glass epoxy plate, or a carbon composite material plate.

Figure 4:
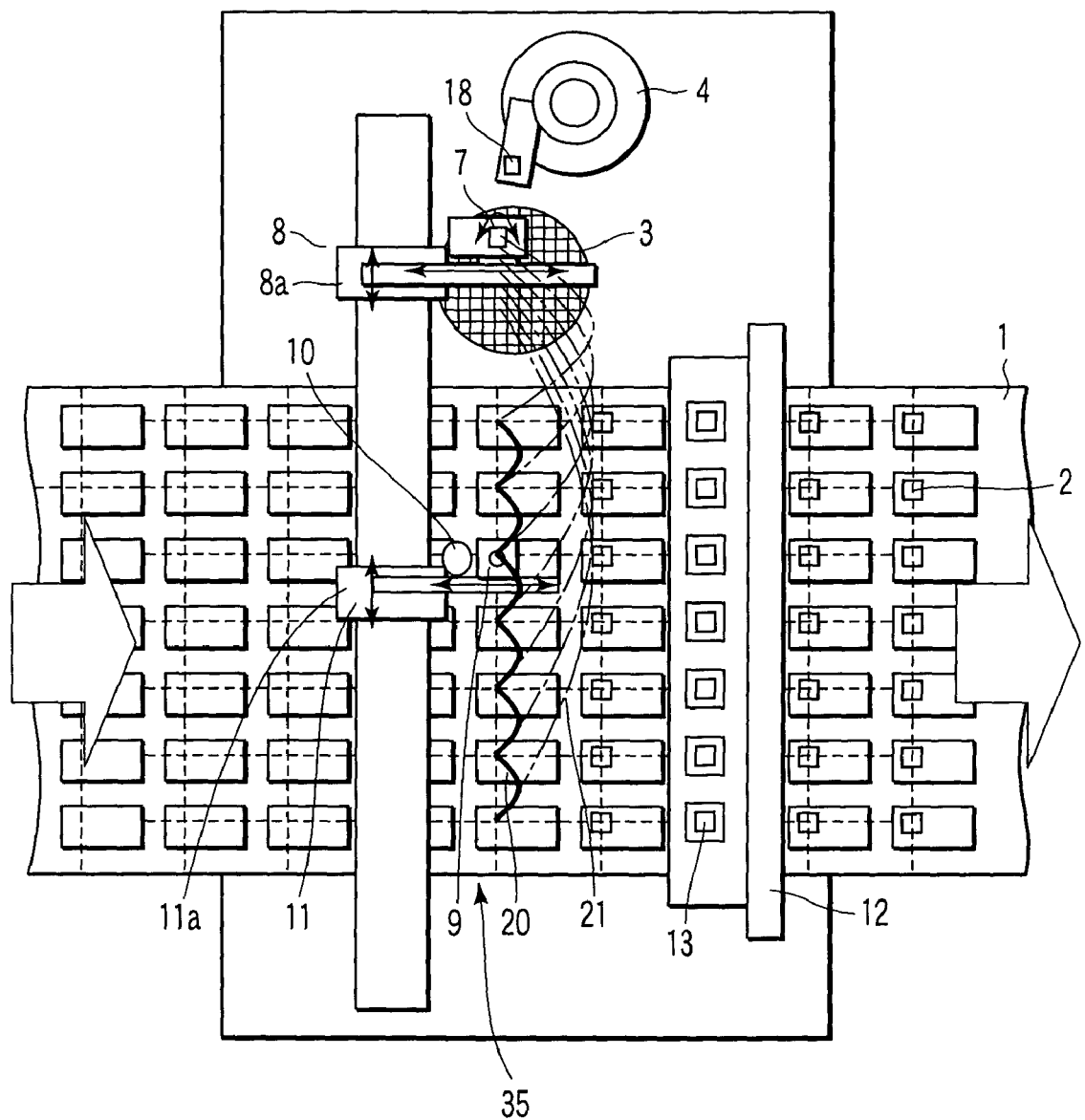
FIG. 4 is a view showing an LSI mounting operation of the LSI mounting apparatus shown in FIG. 1.
Figure 5:
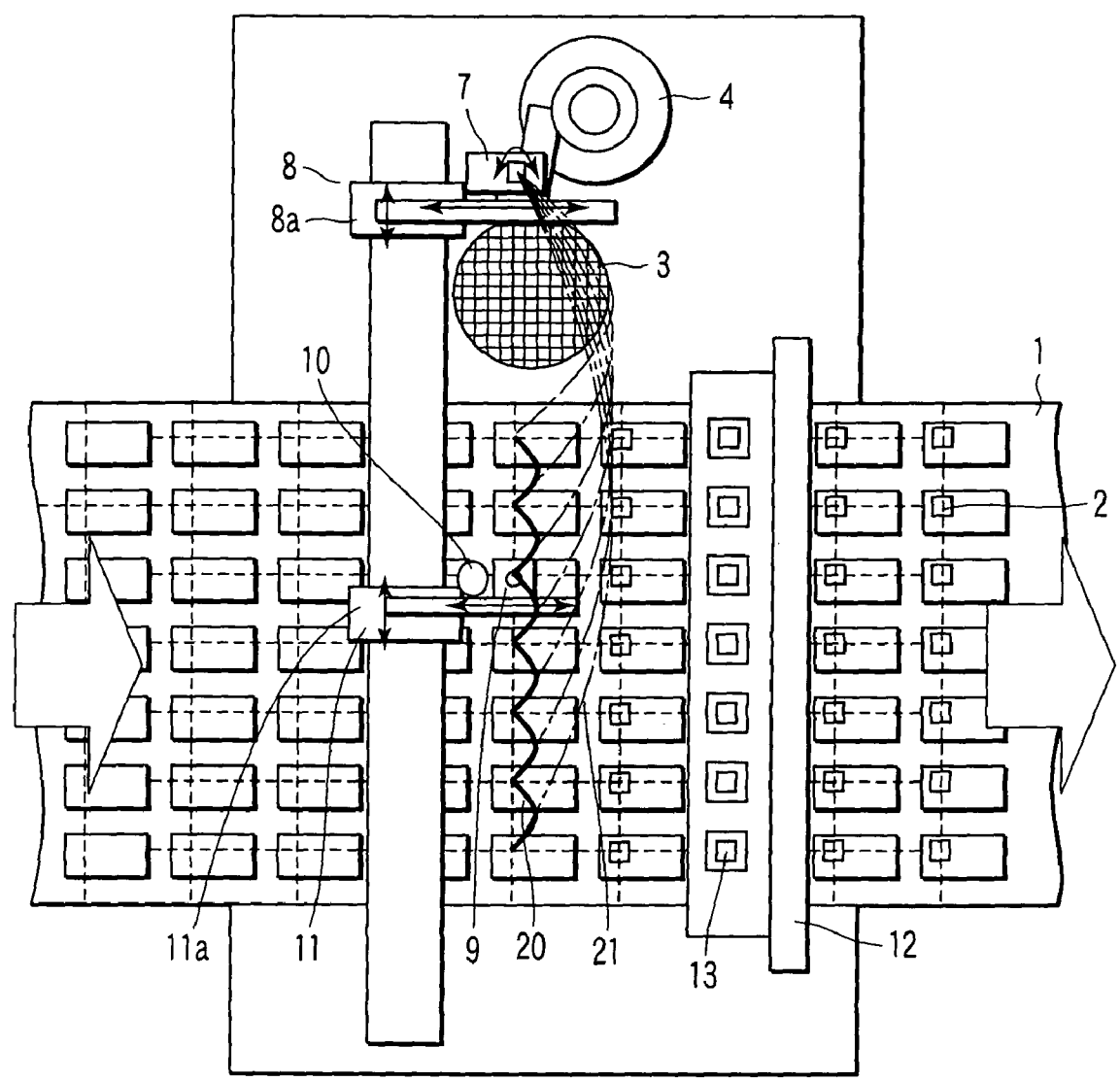
FIG. 5 is a view showing a reinforcing-plate mounting operation of the LSI mounting apparatus showing in FIG. 1.

Referring to FIGS. 4 and 5, there will next be described a mounting operation by the LSI mounting apparatus as configured above.

In response to an operation command from the operating section 30, the substrate 1 is conveyed from the conveying device 32. When reaching the predetermined site 35, the substrate 1 is detected by a detection sensor (not shown), and conveyance of the substrate 1 is stopped (conveying process). After conveyance has stopped, the slider 8a of the mounting unit 8 moves toward the LSI wafer 3 along the robot shaft 6. Subsequently, the slider 11a of the applying unit 11 moves along the robot shaft 6 toward the first line of the individual parts of the final product on the substrate 1, which first line is located close to the LSI wafer 3. After these individual parts of the final product on the substrate 1 are recognized by the monitor camera 10, the adhesive 17 is applied to each of the individual parts of the final product by the dispenser 9 (applying process). After this application, the degree to which each application of the adhesive 17 has spread is inspected by the monitor camera 10 as needed.

After the completion of application of the adhesive 17 to the first line of individual parts of the final product on the substrate 1, the applying unit 11 applies the adhesive 17 to the second line of individual parts of the final product in the same manner by moving the dispenser 9 along a dispensing line 20 (applying process). Subsequently, the adhesive 17 is applied to the third line of individual parts of the final product, the fourth line of individual parts of the final product, and so on (applying processes) in the same manner.

In the course of the application of the adhesive 17, for example, after the completion of the application of the adhesive 17 to the third line of individual parts of the final product, the mounting unit 8 is operated to start the mounting of the LSIs 15. Specifically, the mounting head 7 is moved over the LSI wafer 3 so that each LSI 15 is taken up and held. Then, the mounting head 7 is moved to the first line of individual parts of the final product on the substrate 1 along the corresponding mounting-head moving line 21 such that the LSIs 15 are mounted on the corresponding applications of the adhesive 17 (mounting process). Thereafter, the subsequent LSIs 15 are successively mounted on the corresponding applications of the adhesive 17 on the second line of individual parts of the final product, the third line of individual parts of the final product, etc., on the substrate 1, by repeating the alternating movement of the mounting head 7 between the LSI wafer 3 and the substrate 1 along the mounting-head moving lines 21 in the same manner as described above (mounting processes).

After all the LSIs 15 are mounted on each of the seven individual parts of the final product on the substrate 1 in this way, the slider 8a of the mounting unit 8 approaches the reinforcing-plate supply hopper 4 as shown in FIG. 5. Subsequently, the slider 11a of the applying unit 11 is moved to the first line of individual parts of the final product on the substrate 1, which first line is located close to the LSI wafer 3, and the dispenser 9 applies the adhesive 19 onto each of the LSIs 15 mounted on the first line of individual parts of the final product (applying process). After application, the monitor camera 10 may inspect the degree to which each application of the adhesive 19 has spread as needed.

After the adhesive 19 is applied to the LSIs 15 in the first line of individual parts of the final product on the substrate 1, the applying unit 11 applies the adhesive 19 to the LSIs 15 in the second line of individual parts of the final product in the same manner as described above, by moving the dispenser 9 along the dispenser moving line 20 (applying process). Subsequently, the adhesive 19 is applied to the LSIs 15 in the third line of individual parts of the final product, the LSIs in the fourth line of individual parts of the final product, and so on (applying processes).

In the course of the application of the adhesive 19, for example, after the completion of application of the adhesive 19 to the LSIs 15 in the third line of individual parts of the final product, the mounting unit 8 is operated to start mounting the reinforcing plates 18. Specifically, the mounting head 7 is moved over the supply hopper 4 so that each reinforcing plate 18 is taken up by the mounting head 7. Then, the mounting head 7 approaches the adhesive 19 applied to each of the LSIs 15 in the first line of individual parts of the final product on the substrate 1 along the corresponding mounting-head moving line 21 such that the reinforcing plates 18 are mounted on the corresponding areas of the adhesive 19 in the first line of LSIs 15 (mounting process). Thereafter, subsequent reinforcing plates 18 are successively mounted on the areas of the adhesive 19 on the second line of the LSIs 15, the third line of the LSIs 15, etc., on the substrate 1, by repeating the alternating movement of the mounting head 7 between the supply hopper 4 and the substrate 1 along the mounting-head moving lines 21 in the same manner as described above (mounting processes).

Figure 6:
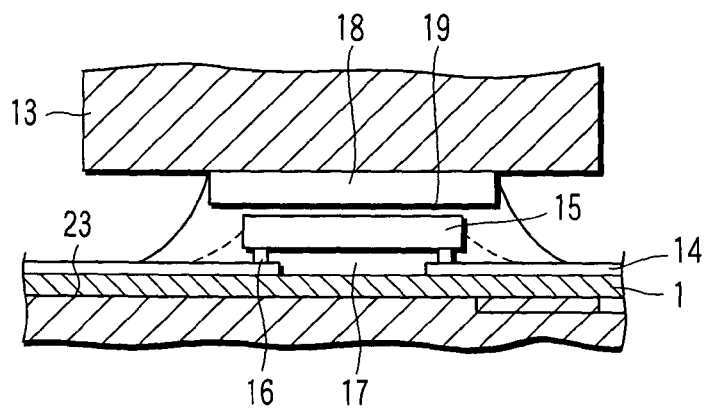
FIG. 6 is a view showing a heated state of an LSI and reinforcing plate mounted on a substrate by the LSI mounting apparatus shown in FIG. 1.

After the mounting of the reinforcing plates 18 on the corresponding areas of adhesive ?17(19)? on each of the seven LSIs 15 is completed in this manner, the substrate 1 is conveyed at a predetermined pitch by the conveying device 32 to the heating unit 12. When the substrate 1 reaches the heating unit 12, as shown in FIG. 6, each LSI 15 and the corresponding reinforcing plate 18 disposed in layers on the substrate 1 are held and pressed between a heating table 23 and the heating head 13 together with the substrate 1 and thereby heated (bonding process). As a result, the adhesives 17 and 19 react to form a bond between the LSI 15 and the corresponding reinforcing plate 18. Accordingly, bumps 16 on the circuit face of each LSI 15 come into contact with the wiring pattern 14 and conduct electricity as a circuit is formed. In this manner, flip chip bonding is completed.

Incidentally, increasing the temperature of the heating head 13 above that of the heating table 23 during the application of heat to the substrate 1 reduces the danger of damage to the substrate 1 of low heat resistance. In addition, independent adjustment of the temperature difference between the heating head 13 and the heating table 23 makes it possible to minimize warp in each product after the hardening of the adhesives 17 and 19.

After flip chip bonding is completed, the substrate 1 is conveyed to a cutting section (not shown) and cut into the individual parts of the final product, and thus the LSI flip mount products each of which has a reinforcing plate, as shown in FIG. 3, are produced. In each product, the reinforcing plate 18 protects the LSI 15 from mechanical external force, making damage, such as cracks, less likely to occur.

According to the present embodiment, as described above, the application of the adhesive 17 to the substrate 1, the mounting of the LSIs 15, the application of the adhesive 19 to the LSIs 15, and the mounting of the reinforcing plates 18 on the corresponding LSIs 15 are all conducted in the predetermined site 35. This eliminates the conventional need to move each substrate to a site where adhesive is applied, then to a site where LSIs are mounted, and further to a site where reinforcing plates are mounted for reinforcement. Also, this reduces the number of times that the position of the substrate 1 needs to be monitored to one, which improves processing efficiency. Further, this minimizes displacement of the LSIs 15 and corresponding reinforcing plates 18.

Moreover, the adhesive 17 is applied simultaneously and in parallel with the mounting of the LSIs 15, and the adhesive 19 is applied simultaneously and in parallel with the mounting of the reinforcing plates 18. This improves the processing speed.

Furthermore, a shorter distance from the mounting device J to the heating unit 12 can be realized, thus minimizing displacement of the LSIs 15 and corresponding reinforcing plates 18 at the time of conveyance of the substrate 1.

The adhesives 17 and 19 are simultaneously heated and hardened while the LSIs 15 and corresponding reinforcing plates 18 are simultaneously heated. Consequently, residual stress between the surface and back of each LSI, due to heat and subsequent contractive hardening, is less likely to occur than in a conventional system in which each LSI 15 and corresponding reinforcing plate are separately heated and hence require that adhesives be heated two times. Accordingly, this makes it easier to ensure satisfactory product quality.

Moreover, the number of times that the adhesives 17 and 19 are subjected to the application of heat and pressure and hardened is one only. This makes the components less likely to be damaged. Furthermore, the adhesive 17 for each LSI and the adhesive 19 for the corresponding reinforcing plate, which come into contact with each other around the LSI 15, are integrally fused and simultaneously hardened. This adds to the LSIs 15 the advantage of enhanced protective strength.

Another reinforcing plate may be mounted on the other side of the substrate 1 opposite to the mounted position of the LSI 15. A structure with reinforcing plates on both sides of the LSI 15 enhances the effect in protecting the LSI 15 from mechanical external force.

The addition of a reinforcing plate can be realized as follows. A reinforcing-plate mounting unit is additionally disposed in upstream of the heating head. Alternatively, after the LSIs 15 and the corresponding reinforcing plates 18 are mounted, the substrate 1 may be inverted, and additional reinforcing plates are mounted by the mounting device J again.

In the embodiment described above, the LSIs 15 are supplied from the LSI wafer 3 but may be separately stored in a chip tray and supplied therefrom.

Additionally, in the embodiment described above, the LSIs 15 are taken up with the circuit side thereof facing down. The invention is not limited thereto but the LSIs 15 may be supplied with the circuit side thereof facing up. In this case, however, the LSIs 15 require inversion by an inverting unit or the like.

In the invention, visual monitor cameras may be additionally disposed at the uptake points of the LSI wafer 3 and reinforcing-plate supply hopper 4. Thus, when each LSI 15 and each reinforcing plate 18 are supplied, minute displacement can be corrected and hence component mounting accuracy is improved.

Also, a visual monitor camera may be additionally disposed adjacent to the mounting head 7 of the mounting mechanism 8 in order to monitor the positions of the LSIs 15 and reinforcing plates 18 to be supplied, the positions at which the LSIs 15 and reinforcing plates 18 have been mounted on the substrate 1, and other such positions. This improves component mounting accuracy and hence the processing speed.

A slider equipped with a camera for monitoring the position of each substrate 1 may be additionally disposed on the robot shaft 6 of the mounting unit J. This makes it possible to independently monitor the position of each substrate 1 before the application of the adhesive by the dispenser 9, thereby improving the processing speed of the apparatus.

More than one dispenser 9 may be provided, and the adhesive for the LSIs may be different from that for the reinforcing plates.

Further, an anisotropic, conductive film supply unit may be used as well as the dispenser 9, in the case of which each LSI 15 may be joined by an anisotropic, conductive film, and each reinforcing plate 18 by a paste adhesive.

In the embodiment described above, a single mounting head 7 and a single dispenser 9 are used. However, their numbers are not limited to one, and more than one mounting head 7 and more than one dispenser 9 may be disposed in the direction of the conveyance of the substrate 1 or in the direction of the width of the substrate 1. This ensures an even faster processing speed.

In the embodiment described above, a single mounting head 7 is used to mount both the LSIs and the reinforcing plates. However, a mounting head for the LSIs and another one for the reinforcing plates may be separately disposed on the slider 8a of the mounting head 7. AS a result, reliability of the conveyance of the LSIs 15 and of the reinforcing plates 18 is further enhanced.

Also, in the invention, an intermediate temporary placement table with a position correcting mechanism may be disposed between the LSI wafer 3 and the substrate 1, and another one between the reinforcing-plate supply hopper 4 and the substrate 1. Further, each intermediate temporary placement table may be provided with an auxiliary conveying unit. Consequently, each LSI 15 and the corresponding reinforcing plate 18 that are being mounted can be temporarily arranged in layers and positioned. This assures improved mounting accuracy and processing speed of the apparatus.

In the embodiment described above, the heating heads 13 are arranged in one line. However, the invention is not limited thereto, and the heating heads 13 may be arranged in more than one line. This allows longer heat-bonding time and hence improved bonding strength. Alternatively, the heat-bonding time originally required may be sub-divided to increase the processing speed of the apparatus.

In the present invention, the mounting head 7 or a substrate-receiving table included in a mounting section may incorporate a heater. This accelerates the reaction of the adhesives, shortens heating time necessary in the heating head 13, and consequently increases the processing speed of the apparatus.

Figure 7:
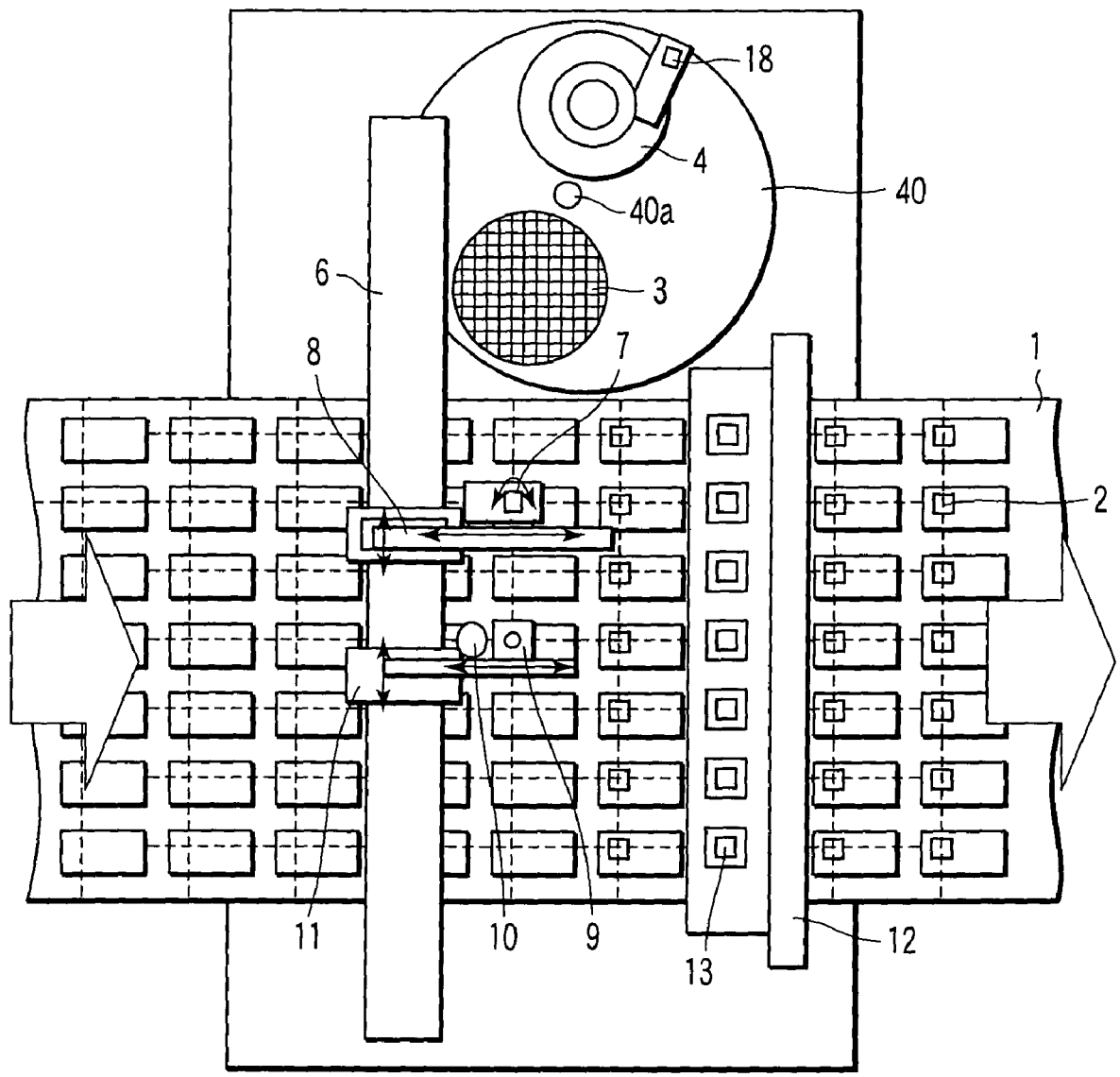
FIG. 7 is a plan view showing an LSI mounting apparatus according to a second embodiment of the present invention.

FIG. 7 shows an LSI mounting apparatus according to a second embodiment of the present invention.

In this embodiment, the same reference numbers refer to the identical components or corresponding parts used in the first embodiment, and explanations thereof are omitted.

Figure 8:
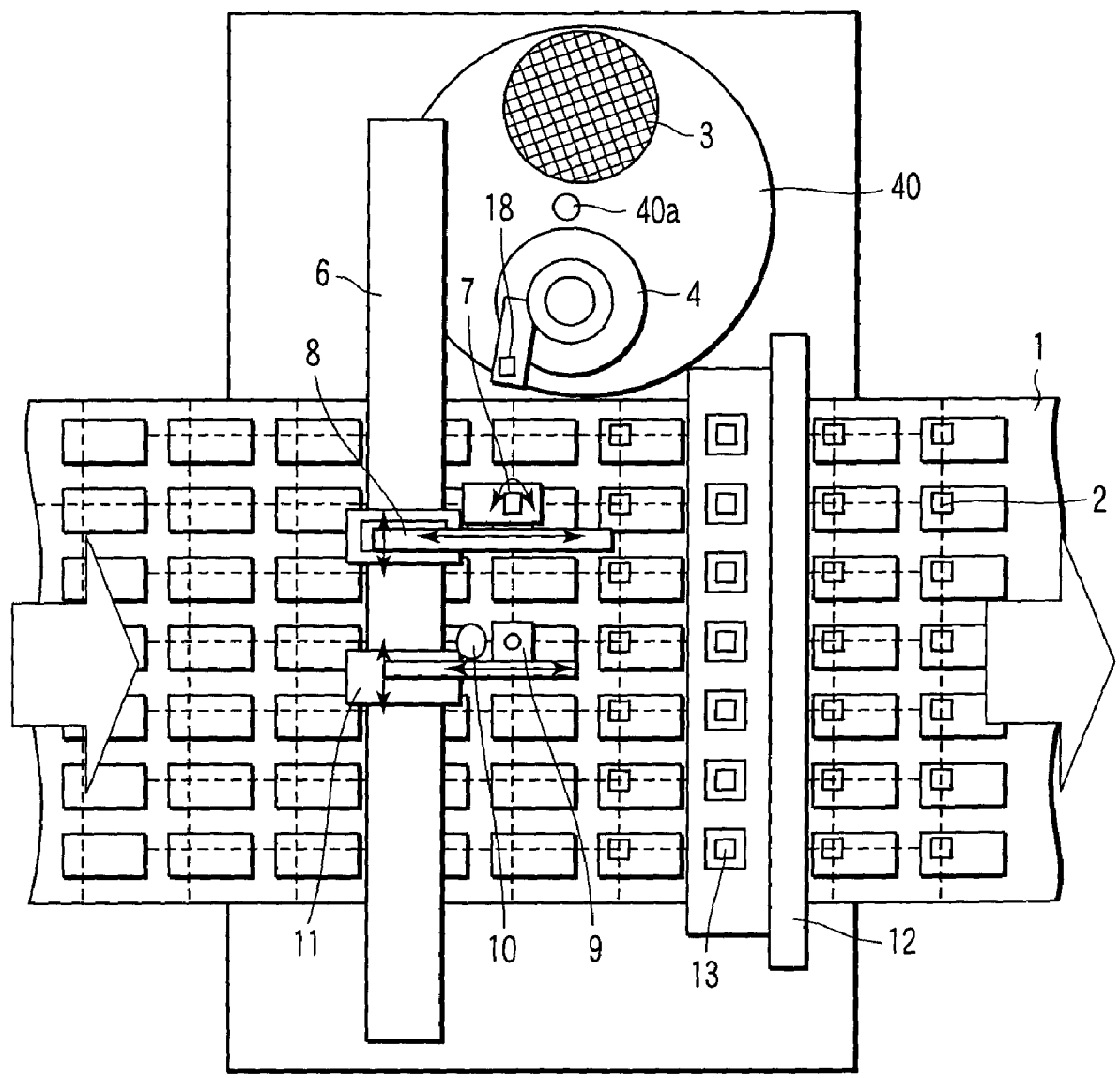
FIG. 8 is a plan view showing the LSI mounting apparatus in which the positions of an LSI wafer and supply hopper in FIG. 7 are exchanged.

In the second embodiment, an LSI wafer 3 and a reinforcing-plate supply hopper 4 are disposed on a turntable 40, namely a holder, so as to be symmetrical with respect to a rotation axis 40a of the turntable 40. The position of the LSI wafer 3 and that of the reinforcing-plate supply hopper 4 can be selectively changed by rotation of the turntable 40, as shown in FIG. 7 or 8.

That is, to take out each LSI 15, the turntable 40 is rotated so that the LSI wafer 3 approaches the mounting head 7 of the mounting mechanism 8, as shown in FIG. 7. To take out each reinforcing plate 18, on the other hand, the turntable 40 is rotated so that the supply hopper 4 approaches the mounting head 7 of the mounting mechanism 8, as shown in FIG. 8.

According to the second embodiment, when each reinforcing plate 18 is supplied, the supply hopper 4 is brought near to the substrate 1. This shortens the distance the reinforcing plate 18 is conveyed to a corresponding individual part of the final product on the substrate 1, and accordingly improves the processing efficiency of the apparatus.

Figure 9:
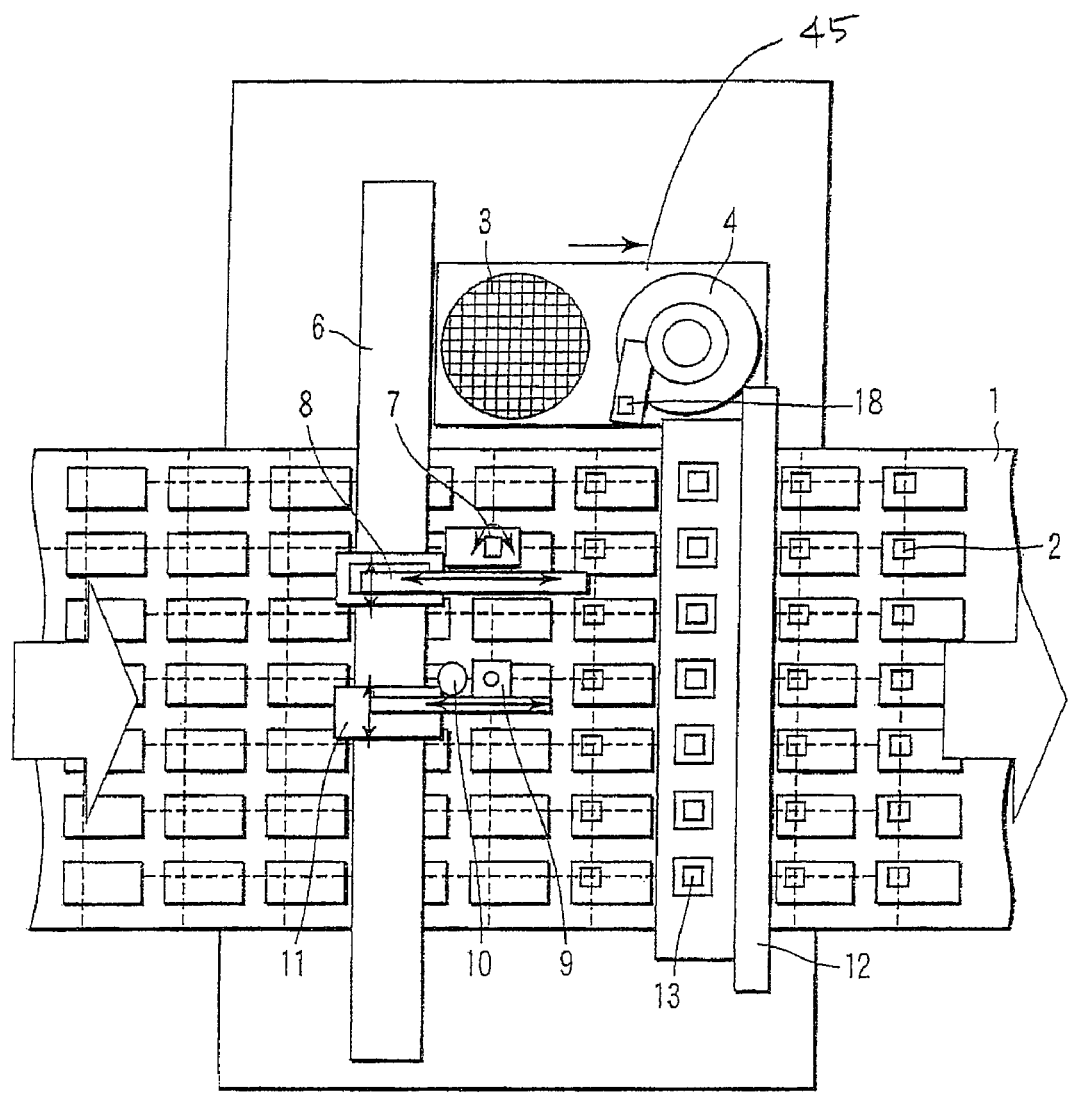
FIG. 9 is a plan view showing an LSI mounting apparatus according to a third embodiment of the present invention.

FIG. 9 shows an LSI mounting apparatus according to a third embodiment of the present invention.

In this embodiment, the same reference numbers refer to the identical components or corresponding parts used in the first embodiment, and explanations thereof are omitted.

In the third embodiment, an LSI wafer 3 and a reinforcing-plate supply hopper 4 are disposed on a slider 45, which serves as a holder movable in directions indicated by the arrows. Moving the slider 45 makes it possible to selectively change the positions of the LSI wafer 3 and that of the supply hopper 4.

Figure 10:
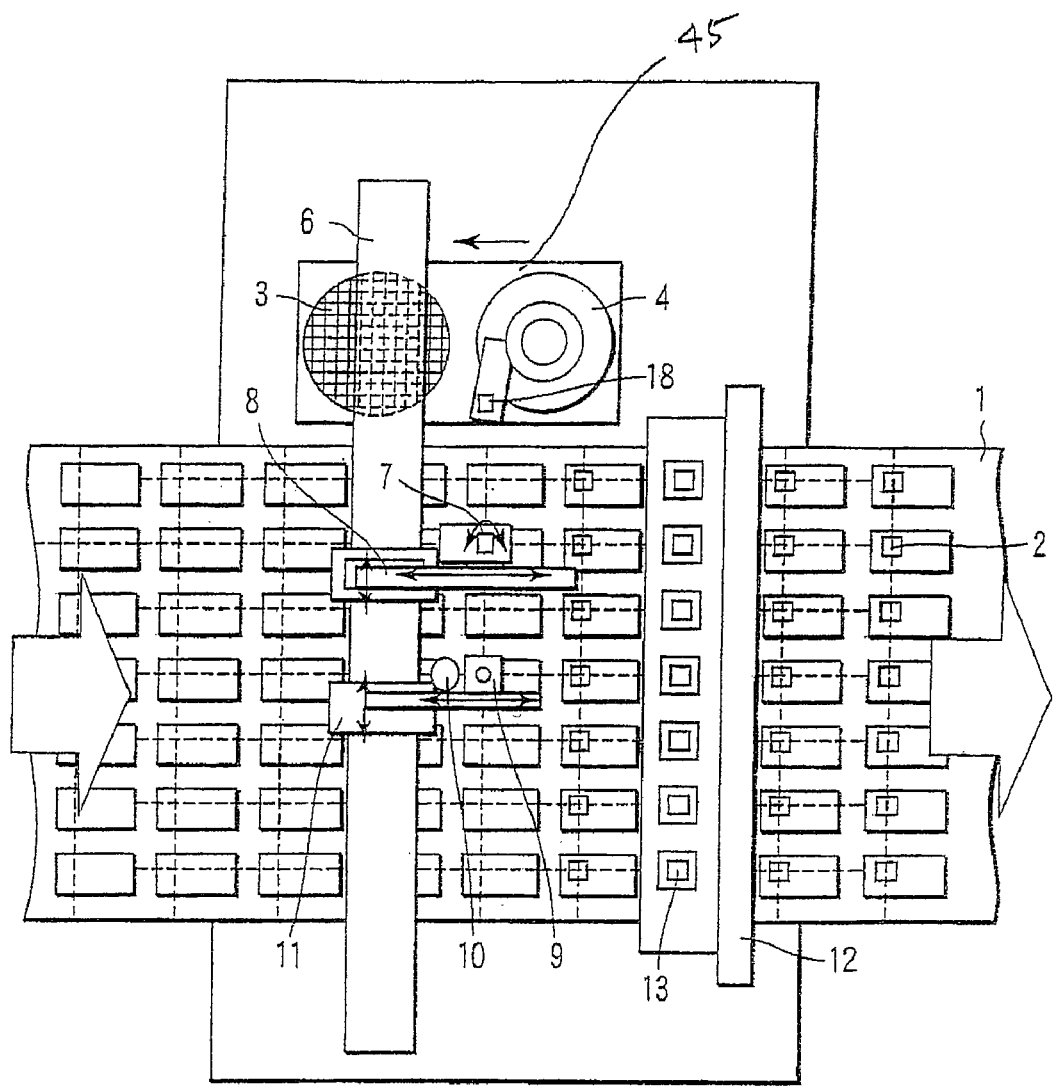
FIG. 10 is a plan view showing the LSI mounting apparatus in which the positions of an LSI wafer and supply hopper in FIG. 9 are exchanged.

That is, to take out each LSI 15, the slider 45 is moved so that the LSI wafer 3 approaches the mounting head 7 of the mounting mechanism 8, as shown in FIG. 9. To take out each reinforcing plate 18, on the other hand, the slider 45 moves so that the supply hopper 4 approaches the mounting head 7 of the mounting mechanism 8, as shown in FIG. 10.

According to the third embodiment, when each reinforcing plate 18 is supplied, the supply hopper 4 approaches the mounting head 7 of the mounting mechanism 8. This shortens the distance the reinforcing plate 18 is conveyed to a corresponding individual part of the final product on the substrate 1, and hence improves the processing efficiency of the apparatus.

FIG. 11 shows an LSI mounting apparatus according to a fourth embodiment of the present invention.

In this embodiment, the same reference numbers refer to the identical components or corresponding parts used in the first embodiment, and explanations thereof are omitted.

In the fourth embodiment, two supply hoppers 4, two mounting heads 7, two dispensers 9, two monitor cameras 10 are used. In addition, two parallel lines of seven spaced heating heads 13 are disposed perpendicular to the direction of the conveyance of a substrate 1. Further, two monitor cameras 51 for monitoring the position of a substrate are provided. The monitor cameras 51 are disposed on a slider 50, which is moved in the axial direction of a robot shaft 6.

A component mounting operation is carried out in the manner described below. First, while moving away from an LSI wafer 3, the slider 50 monitors component mounting positions on the substrate by using the monitor cameras 51.

After the slider 50 is moved a predetermined distance sufficient for the slider 50 to cause no mechanical interference, the slider 11a of an applying mechanism 11 is operated such that the two dispensers 9 apply an adhesive to every two component mounting position on the substrate. After the slider 11a of the applying mechanism 11 has moved a predetermined distance sufficient for the slider 11a to cause no mechanical interference, the mounting heads 7 of a mounting mechanism 8 start mounting components.

The foregoing fourth embodiment is identical to the first embodiment in basic operation. However, since the monitor cameras 51 are additionally provided, the processing speed is improved.

Moreover, the monitoring of the substrate, the application of the adhesive, and the mounting of the LSIs are carried out simultaneously and parallel to each other in two lines. Accordingly, the ability to process per hour is about two times higher than in the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic component mounting method comprising: applying, via an applying unit, an adhesive to a substrate located in a predetermined site, mounting an electronic component onto the application of the adhesive via a mounting unit, subsequently applying, by the applying unit, an adhesive onto the mounted electronic component, and mounting, by the mounting unit, a reinforcing plate onto the application of the adhesive on the mounted electronic component; conveying, from the predetermined site, the substrate with the mounted electronic component and mounted reinforcing plate to a heating site; and bonding, by an application of heat at the heating site, the mounted electronic component to the mounted reinforcing plate and the mounted electronic component to the substrate.

* * * * *